(12) United States Patent
Shakuda

(10) Patent No.: US 7,847,305 B2
(45) Date of Patent: Dec. 7, 2010

(54) SEMICONDUCTOR LIGHT EMITTING DEVICE

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/226,007

(22) PCT Filed: Apr. 3, 2007

(86) PCT No.: PCT/JP2007/057472
§ 371 (c)(1),
(2), (4) Date: Oct. 3, 2008

(87) PCT Pub. No.: WO2007/119663
PCT Pub. Date: Oct. 25, 2007

(65) Prior Publication Data
US 2009/0278143 A1    Nov. 12, 2009

(30) Foreign Application Priority Data
Apr. 4, 2006    (JP) .............................. 2006-103325

(51) Int. Cl.
*H01L 33/00* (2010.01)
(52) U.S. Cl. ..................... 257/93; 257/79; 257/E29.03; 257/E33.001
(58) Field of Classification Search ................. 257/594, 257/656, 910, E33.046, E27.046, E27.051, 257/E29.327–E29.331, E29.333, E25.032, 257/E29.219–E29.22
See application file for complete search history.

(56) References Cited

U.S. PATENT DOCUMENTS 5,814,841 A * 9/1998 Kusuda et al. .............. 257/113
2004/0080941 A1 * 4/2004 Jiang et al. ................... 362/252
2005/0168162 A1    8/2005 Inoue
2005/0253151 A1    11/2005 Sakai et al.
2007/0278502 A1    12/2007 Shakuda et al.
2007/0284598 A1    12/2007 Shakuda et al.

FOREIGN PATENT DOCUMENTS

JP    55-029178    3/1980
JP    2000-101136    4/2000

(Continued)

*Primary Examiner*—N Drew Richards
*Assistant Examiner*—Mamadou Diallo
(74) *Attorney, Agent, or Firm*—Rabin & Berdo, PC

(57) ABSTRACT

A plurality of transistors are formed on a substrate in a plurality of columns. Each transistor has a first conductivity type region and second conductivity type regions provided on both sides thereof in a column direction, and has an active layer on the side of each second conductivity type region closer to the substrate. Between two columns adjacent to each other, the second conductivity type region on a first side in the column direction of each transistor arranged on a first column, the second conductivity type region on a second side in the column direction of the transistor adjacent to this transistor on the first side in the column direction and the first conductivity type region of each transistor arranged on a second column are electrically connected by a first wire. Between these two columns, the second conductivity type region on the first side in the column direction of each transistor arranged on the second column, the second conductivity type region on the second side in the column direction of the transistor adjacent to this transistor on the first side in the column direction and the first conductivity type region of each transistor arranged on the first column are electrically connected by a second wire.

3 Claims, 5 Drawing Sheets

FOREIGN PATENT DOCUMENTS

| | | |
|---|---|---|
| JP | 2001-177187 | 6/2001 |
| JP | 2004-006582 | 1/2004 |
| JP | 2005-216812 | 8/2005 |
| JP | 2006-073815 | 3/2006 |
| JP | 2006-080442 | 3/2006 |

* cited by examiner

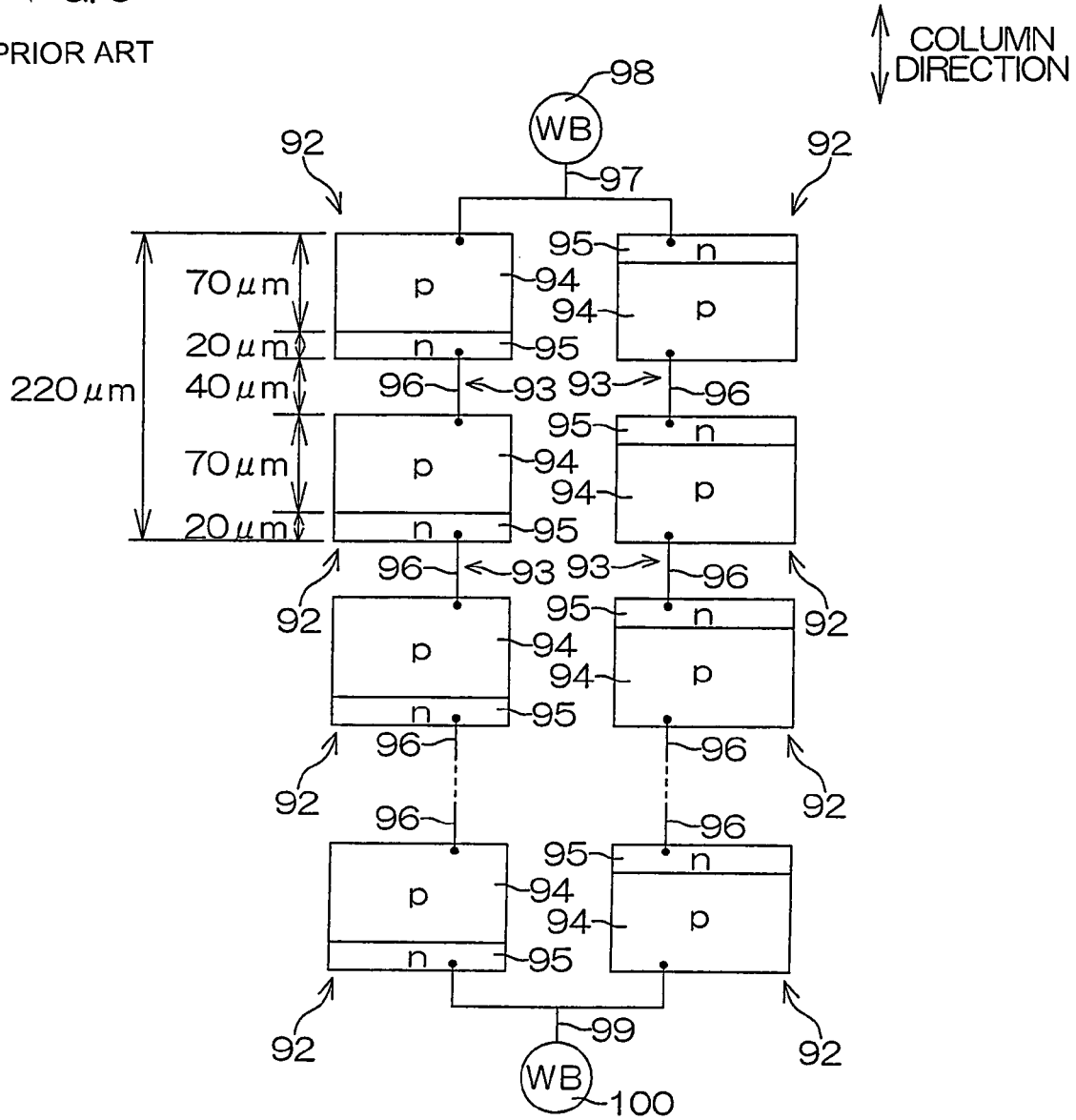

SEMICONDUCTOR LIGHT EMITTING DEVICE

TECHNICAL FIELD

The present invention relates to an AC-driven semiconductor light emitting device.

PRIOR ART

In recent years, an AC-driven semiconductor light emitting device has been employed for a backlight of a display or an illuminator.

FIG. 5 is a plan view schematically showing the structure of a conventional AC-driven type semiconductor light emitting device.

This semiconductor light emitting device 91 has a structure formed by arranging a large number of LEDs 92 on a sapphire substrate in two columns. In each column, the LEDs 92 adjacent to one another are isolated by isolation regions 93.

Each LED 92 includes a p-type region 94 and an n-type region 95. In the LEDs 92 forming a first column (right column in FIG. 5) and the LEDs 92 forming a second column (left column in FIG. 5), the sequences of the p-type regions 94 and the n-type regions 95 are reversed. Toward one side (lower side in FIG. 5) in the column direction, therefore, the p-type region 94, the n-type region 95, the isolation region 93, the p-type region 94, then-type region 95, . . . , the isolation region 93, the p-type region 94 and the n-type region 95 are aligned in the first column, while the n-type region 95, the p-type region 94, the isolation region 93, the n-type region 95, the p-type region 94, . . . , the isolation region 93, the n-type region 95 and the p-type region 94 are aligned in the second column.

In each column, the p-type regions 94 and the n-type regions 95 adjacent to one another through the isolation regions 93 are connected with one another by wires 96 arranged over the isolation regions 93. The p-type region 94 on an end of the first column and the n-type region 95 on an end of the second column are connected to a wire bonding region 98 by a wire 97. Further, the n-type region 95 on the other end of the first column and the p-type region 94 on the other end of the second column are connected to a wire bonding region 100 by a wire 99.

The wire bonding regions 98 and 100 are connected by bonding wires with wires on a substrate on which the semiconductor light emitting device 91 is mounted. Alternating voltages of 100 V, for example, are applied to the wire bonding regions 98 and 100 from the wires through the bonding wires. When the alternating voltages are applied to the wire bonding regions 98 and 100, a potential difference takes place between the p-type region 94 and the n-type region 95 of each LED 92, and each LED 92 emits light.

Patent Document 1: Japanese Unexamined Patent Publication No. 2005-216812

DISCLOSURE OF THE INVENTION

Problems to be Solved

An active layer provided under the p-type region 94 generates light in each LED 92. In the semiconductor light emitting device 91 of the aforementioned structure, therefore, only the p-type region 94 serves as a light emitting region while the n-type region 95 and the isolation region 93 held between the p-type regions 94 do not generate light, and the area (light emitting area) of the light emitting region is small. The area of the p-type region 94 can be increased by increasing the width of the p-type region 94 in the column direction and/or the direction orthogonal to the column direction, thereby the light emitting area of the light emitting region can be increased. However, this technique results in increase of the size of the semiconductor light emitting device.

An object of the present invention is to provide a semiconductor light emitting device capable of enlarging a light emitting area without increasing the size of the overall device.

Solutions to the Problems

A semiconductor light emitting device according to the present invention for attaining the object includes: a substrate; a plurality of transistors formed on the substrate in a plurality of columns, each having a first conductivity type region and second conductivity type regions provided on both sides thereof in the column direction and having an active layer on the side of each second conductivity type region closer to the substrate; a first wire electrically connecting the second conductivity type region on a first side in the column direction of the transistor arranged on a first column, the second conductivity type region on a second side in the column direction of the transistor adjacent to this transistor on the first side in the column direction and the first conductivity type region of the transistor arranged on the second column between two columns adjacent to each other; and a second wire electrically connecting the second conductivity type region on the first side in the column direction of the transistor arranged on a second column, the second conductivity type region on the second side in the column direction of the transistor adjacent to this transistor on the first side in the column direction and the first conductivity type region of the transistor arranged on the first column between the two columns.

In other words, the plurality of transistors are formed on the substrate in the plurality of columns in this semiconductor light emitting device. Each transistor has the first conductivity type region and the second conductivity type regions provided on both sides thereof in the column direction. Further, each transistor has the active layer in each second conductivity region on the side of the substrate. Between the two columns adjacent to each other, the second conductivity type region on the first side in the column direction of the transistor arranged on the first column, the second conductivity type region on the second side in the column direction of the transistor adjacent to this transistor on the first side in the column direction and the first conductivity type region of the transistor arranged on the second column are electrically connected by the first wire. Further, the second conductivity type region on the first side in the column direction of the transistor arranged on the second column, the second conductivity type region on the second side in the column direction of the transistor adjacent to this transistor on the first side in the column direction and the first conductivity type region of the transistor arranged on the first column are electrically connected by the second wire.

According to this structure, the areas of the second conductivity type regions serving as light emitting regions upon voltage application can be enlarged without increasing the size of the overall device as compared with a structure formed by serially arranging LEDs having first conductivity type regions and second conductivity type regions.

If the width of each first conductivity type region in the column direction is 20 μm and the width of each second conductivity type region in the column direction is 100 μm, for example, the width of each transistor in the column direction is 220 μm, and in this region having the width of 220 μm, a region having the total width of 200 μm of the two second conductivity type regions serves as a light emitting region. In the structure formed by serially arranging the LEDs having the first conductivity type regions and the second conductivity type regions as in the structure shown in FIG. 5, on the other hand, the column-directional width of a region including two LEDs adjacent to each other in the column direction (width from the first conductivity type region of the first LED to the second conductivity type region of the second LED) is 220 μm if the width of each first conductivity type region in the column direction is 20 μm, the width of each second conductivity type region in the column direction is 70 μm and the column-directional width of an isolation groove isolating the LEDs from each other is 40 μm, while only a region having the total width of 140 μm of the two second conductivity type regions serves as a light emitting region in this region having the width of 220 μm. Thus, according to the aforementioned structure, the areas of the second conductivity type regions serving as light emitting regions upon voltage application can be enlarged without increasing the size of the overall device.

Preferably, the transistors are so arranged that the first conductivity type region of the first column is opposed to a space between transistors adjacent to each other in the second column in a direction orthogonal to the column direction and the first conductivity type region of the second column is opposed to a space between transistors adjacent to each other in the first column in the direction orthogonal to the column direction.

According to this structure, the first wire and the second wire can be so arranged as not to intersect with each other in plan view as viewed from a direction perpendicular to the substrate. Therefore, no structure (structure of forming the first wire and the second wire on layers different from each other and interposing an insulating layer there between, for example) is required for preventing a short circuit between the first wire and the second wire, and the structure of the device can be simplified.

Preferably, the semiconductor light emitting device further includes a semiconductor multilayer portion formed by stacking a plurality of gallium nitride semiconductor layers on the substrate, and each transistor is electrically isolated from another transistor in each column by an isolation groove formed by digging the semiconductor multilayer portion from the surface thereof in the stacking direction.

According to this structure, a plurality of transistors electrically isolated from one another can be formed by forming the isolation groove on the semiconductor multilayer portion.

The transistors may be formed on the substrate in two columns.

The foregoing and other objects, features and effects of the present invention will become more apparent from the following detailed description of the preferred embodiments with reference to the attached drawings.

BRIEF DESCRIPTION OF THE DRAWINGS

FIG. 5 A plan view schematically showing the structure of a conventional AC-driven type semiconductor light emitting device.

DESCRIPTION OF THE REFERENCE NUMERALS

Figure 1:
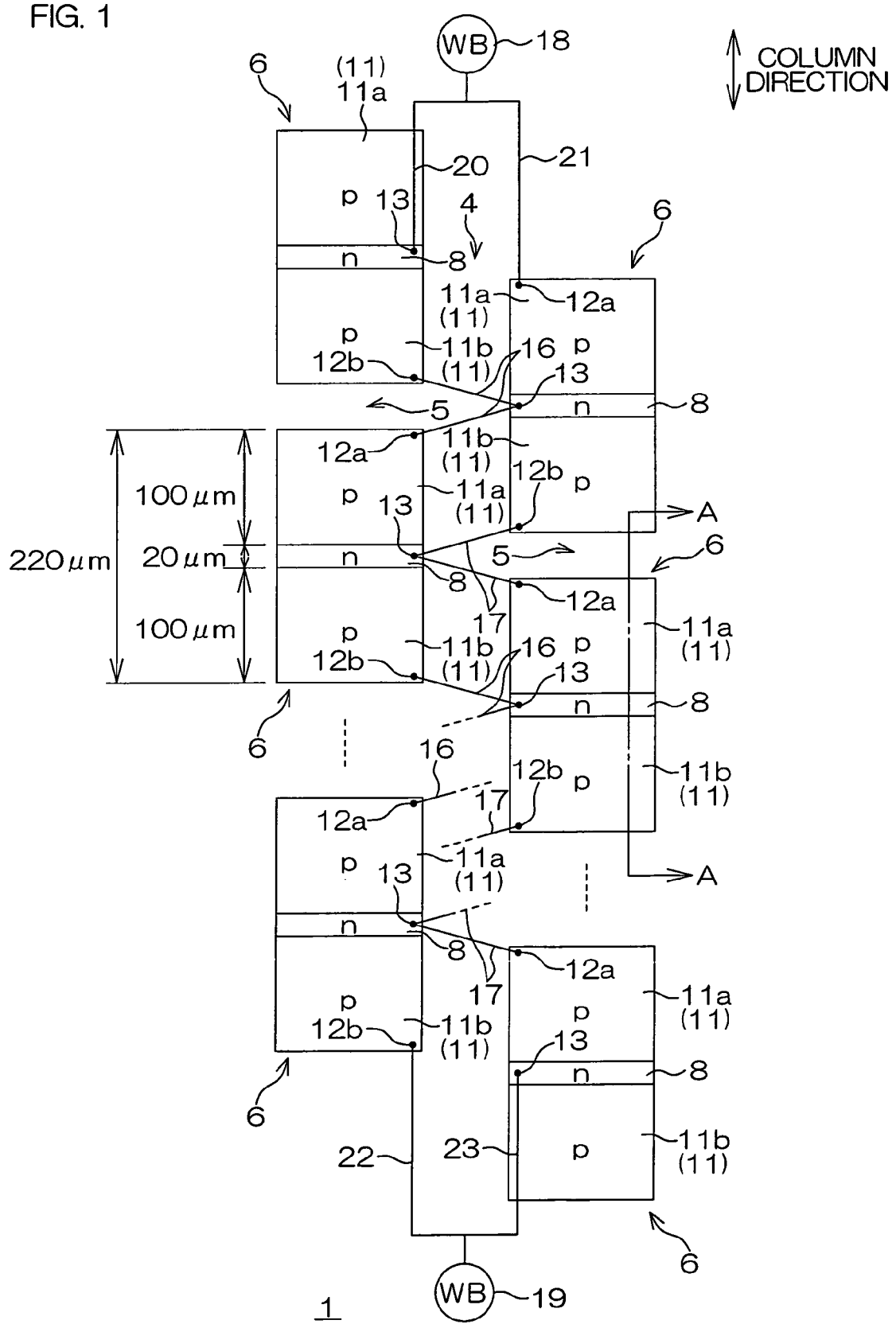
FIG. 1 A plan view schematically showing the structure of a semiconductor light emitting device according to an embodiment of the present invention.

1 semiconductor light emitting device
2 sapphire substrate
3 semiconductor multilayer portion
6 transistor
7 low-temperature buffer layer (gallium nitride semiconductor layer)
8 high-temperature buffer layer (gallium nitride semiconductor layer)
9 n-type cladding layer (gallium nitride semiconductor layer)
10 active layer (gallium nitride semiconductor layer)
11 p-type cladding layer (gallium nitride semiconductor layer)
11a p-type cladding layer
11b p-type cladding layer
16 wire (first wire)
17 wire (second wire)
31 semiconductor light emitting device
41 semiconductor light emitting device

BEST MODE FOR CARRYING OUT THE INVENTION

An embodiment of the present invention is now described in detail with reference to the accompanying drawings.

Figure 2:
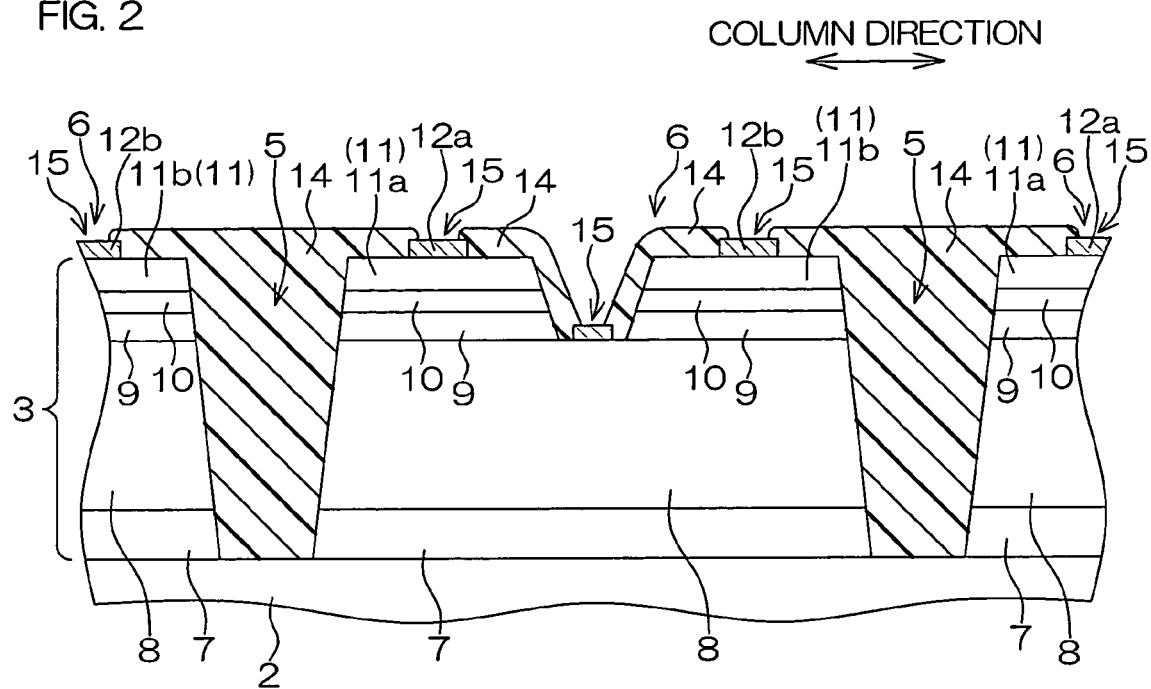
FIG. 2 A sectional view taken along the cutting line A-A shown in FIG. 1.

FIG. 1 is a plan view schematically showing the structure of a semiconductor light emitting device according to the embodiment of the present invention. FIG. 2 is a sectional view taken along the cutting line A-A shown in FIG. 1.

The semiconductor light emitting device 1 is an AC-driven type semiconductor light emitting device connected to a commercial AC source (AC 100 V) to be preferably employable for an illuminator or the like, for example. The semiconductor light emitting device 1 includes a sapphire ($Al_2O_3$ single crystal) substrate 2 and a semiconductor multilayer portion 3 formed on the sapphire substrate 2, as shown in FIG. 2.

In the semiconductor multilayer portion 3, a plurality of transistors 6 are formed to be electrically isolated from one another by column isolation grooves 4 and element isolation grooves 5 dug from the surface thereof, as shown in FIG. 1. The plurality of transistors 6 are arranged in two columns, and plurally arranged in each column in the column direction thereof.

More specifically, the semiconductor multilayer portion 3 has a structure formed by stacking a low-temperature buffer layer 7 made of GaN (gallium nitride), a high-temperature buffer layer 8, formed under a higher temperature than the low-temperature buffer layer 7, made of GaN doped with an n-type impurity (Si, for example), an n-type cladding layer 9 made of GaN doped with an n-type impurity (Si, for example), an active layer 10 made of GaN mixed with In (indium) and a p-type cladding layer 11 made of GaN doped with a p-type impurity (Mg, for example) on the sapphire substrate 2 in this order, as shown in FIG. 2. The column isolation grooves 4 and the element isolation grooves 5 (only the element isolation grooves 5 are illustrated in FIG. 2) are formed in a depth reaching the surface of the sapphire substrate 2 from the surface of the p-type cladding layer 11. Thus, the semiconductor multilayer portion 3 is separated into the plurality of transistors 6.

In each transistor 6, the n-type cladding layer 9, the active layer 10 and the p-type cladding layer 11 are removed from the central portion in the column direction. In other words, the n-type cladding layer 9, the active layer 10 and the p-type cladding layer 11 are formed on only both end portions of each transistor 6 in the column direction, and the high-temperature buffer layer 8 as a first conductivity type region is exposed on the central portion of each transistor 6 in the column direction from the space between the portions of the p-type cladding layer 11 formed on both ends. P-side electrodes 12a and 12b made of an Ni (nickel)-Au (gold) alloy, for example, are formed on the surfaces of the portions of the p-type cladding layer 11 formed on both ends. An n-side electrode 13 made of a Ti (titanium)-Al (aluminum) alloy, for example, is formed on the surface of the high-temperature buffer layer 8 on the central portion. Thus, each transistor 6 has one n-side electrode 13 and the p-side electrodes 12a and 12b provided on both sides thereof in the column direction.

The surface of the semiconductor multi layer portion 3 is covered with an insulating film 14 made of silicon oxide ($SiO_2$), for example. The insulating film 14 fills up the column isolation grooves 4 and the element isolation grooves 5. Openings 15 for exposing the p-side electrodes 12a and 12b and the n-side electrode 13 respectively are formed in the insulating film 14.

In the following description, the p-type cladding layer 11 as a second conductivity type region arranged on a first-side end portion (upper side end portion in FIG. 1) of each transistor 6 in the column direction is referred to as "p-type cladding layer 11a", and the p-type cladding layer 11 as a second conductivity type region arranged on a second-side end portion (lower side end portion in FIG. 1) is referred to as "p-type cladding layer 11b". Further, a portion of the high-temperature buffer layer 8 facing the space between the p-type cladding layer 11a and the p-type cladding layer 11b is simply referred to as "high-temperature buffer layer 8".

In the semiconductor light emitting device 1, the transistors 6 of the respective columns are so arranged that the high-temperature buffer layers 8 of a first column (left column in FIG. 1) are opposed to the element isolation grooves 5 of a second column (right column in FIG. 1) in a direction orthogonal to the column direction and the high-temperature buffer layers 8 of the second column are opposed to the element isolation grooves 5 of the first column in the direction orthogonal to the column direction, as shown in FIG. 1.

On the insulating film 14, wires 16 and 17 connecting the p-side electrodes 12a and 12b and the n-side electrodes 13 with one another between the respective columns of the transistors 6 are alternately formed in the column direction.

Each wire 16 connects the p-side electrode 12a provided on the p-type cladding layer 11a of each transistor 6 of the first column, the p-side electrode 12b provided on the p-type cladding layer 11b of the transistor 6 adjacent to the first side (upper side in FIG. 1) of this transistor 6 in the column direction and the n-side electrode 13 provided on each high-temperature buffer layer 8 of the second column. Thus, the p-type cladding layer 11a, the p-type cladding layer 11b and the high-temperature buffer layer 8 are electrically connected through the wire 16.

Each wire 17 connects the p-side electrode 12a provided on the p-type cladding layer 11a of each transistor 6 of the second column, the p-side electrode 12b provided on the p-type cladding layer 11b of the transistor 6 adjacent to the first side of this transistor 6 in the column direction, the p-side electrode 12a on the first side in the column direction and the p-side electrode 12b on the second side in the column direction of the transistor 6 adjacent to the first side of this transistor 6 in the column direction and the n-side electrode 13 of each high-temperature buffer layer 8 of the first column. Thus, the p-type cladding layer 11a, the p-type cladding layer 11b and the high-temperature buffer layer 8 are electrically connected through the wire 17.

This semiconductor light emitting device 1 includes two wire bonding regions 18 and 19.

The n-side electrode 13 provided on the high-temperature buffer layer 8 of the transistor 6 arranged on the first-side end portion of the first column is connected to the wire bonding region 18 by a wire 20. The p-side electrode 12a provided on the p-type cladding layer 11a of the transistor 6 arranged on the first-side end portion of the second column is connected to the wire bonding region 18 by a wire 21.

The p-side electrode 12b provided on the p-type cladding layer 11b of the transistor 6 arranged on the second-side end portion of the first column is connected to the wire bonding region 19 by a wire 22. The n-side electrode 13 provided on the high-temperature buffer layer 8 of the transistor 6 arranged on the second-side end portion of the second column is connected to the wire bonding region 19 by a wire 23.

Wires (not shown) for electrical connection with a substrate (not shown) on which the semiconductor light emitting device 1 is mounted are bonded to the wire bonding regions 18 and 19. Alternating voltages of 100 V, for example, are applied from the substrate to the wire bonding regions 19 and 19 through the wires. When the alternating voltages are applied to the wire bonding regions 18 and 19, potential differences take place between the p-side electrode 12a and the n-side electrode 13 and between the p-side electrode 12b and the n-side electrode 13 of each transistor 6 respectively, and the active layer 10 of each transistor 6 emits light.

In this semiconductor light emitting device 1, as herein above described, the plurality of transistors 6 are formed on the sapphire substrate 2 in the two columns. Each transistor 6 has the n-type high-temperature buffer layer 8 and the p-type cladding layers 11a and 11b provided on both sides thereof in the column direction in plan view. Further, each transistor 6 has the active layer 10 under each of the p-type cladding layers 11a and 11b. Between the two columns, the p-type cladding layer 11a of each transistor 6 arranged on the first column, the p-type cladding layer 11b of the transistor 6 adjacent to the first side of this transistor 6 in the column direction and the high-temperature buffer layer 8 of each transistor 6 arranged on the second column are electrically connected by the wire 16. Further, the p-type cladding layer 11a of each transistor 6 arranged on the second column, the p-type cladding layer 11b of the transistor 6 adjacent to the first side of this transistor 6 in the column direction and the high-temperature buffer layer 8 of each transistor 6 arranged on the first column are electrically connected by the wire 17.

According to this structure, the areas of light emitting regions upon voltage application can be enlarged without increasing the size of the overall device, as compared with the structure formed by serially arranging the LEDs having the n-type regions and the p-type regions.

If the width of each high-temperature buffer layer 8 in the column direction is 20 μm and the width of each p-type cladding layer 11 in the column direction is 100 μm, for example, the width of each transistor 6 in the column direction is 220 μm, and in this region having the width of 220 μm, a region having the total width of 200 μm of the two p-type cladding layers 11 serves as a light emitting region. In the structure formed by serially arranging the LEDs 92 having the p-type regions 94 and the n-type regions 95 as in the structure shown in FIG. 5, on the other hand, the column-directional width of a region including two LEDs 92 adjacent to each other in the column direction (width from the n-type region 95 of the first LED 92 to the p-type region 96 of the second LED 92) is 220 µm if the width of each n-type region 95 in the column direction is 20 µm, the width of each p-type region 94 in the column direction is 70 µm and the column-directional width of each isolation groove 93 isolating the LEDs 92 from each other is 40 µm, while only a region having the total width of 140 µm of the two p-type regions 96 serves as a light emitting region in this region having the width of 220 µm. Thus, according to the structure of this embodiment, the areas of the light emitting regions upon voltage application can be enlarged without increasing the size of the overall device.

In this semiconductor light emitting device 1, further, the transistors 6 of the respective columns are so arranged that the high-temperature buffer layers 8 of the first column are opposed to the element isolation grooves 5 of the second column in the direction orthogonal to the column direction and the high-temperature buffer layers 8 of the second column are opposed to the element isolation grooves 5 of the first column in the direction orthogonal to the column direction. Due to this arrangement, the wires 16 and 17 can be so arranged as not to intersect with one another in plan view, as shown in FIG. 1. Thus, no structure (structure of forming the wires 16 and 17 on layers different from each other and interposing an insulating layer there between, for example) is required for preventing a short circuit between the wires 16 and 17, and the structure of the device can be simplified.

While the structure formed by arranging the plurality of transistors 6 in the two columns has been described with reference to this embodiment, a structure formed by arranging a plurality of transistors 6 in three or more columns may be employed.

Figure 3:
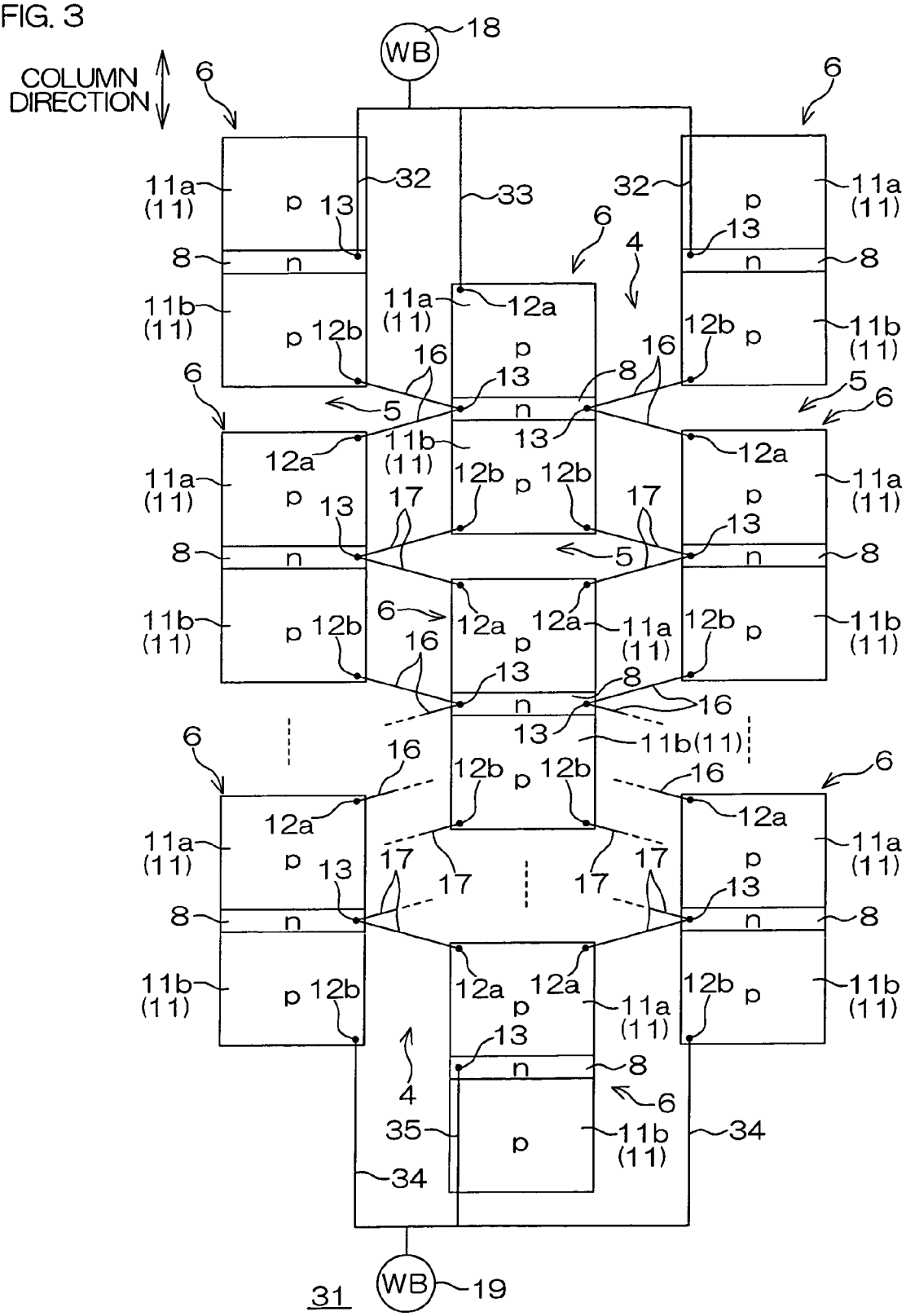
FIG. 3 A plan view schematically showing a structure formed by arranging a plurality of transistors in three columns.

FIG. 3 is a plan view schematically showing a structure formed by arranging a plurality of transistors 6 in three columns. Referring to FIG. 3, portions corresponding to the respective portions shown in FIG. 1 are denoted by the same reference numerals as the respective portions. In the following, detailed description as to the portions denoted by the same reference numerals is omitted.

A semiconductor light emitting device 31 shown in FIG. 3 is formed by arranging the plurality of transistors 6 in the three columns, and the transistors 6 of the respective columns are so arranged that high-temperature buffer layers 8 of a first column are opposed to element isolation grooves 5 of a second column in a direction orthogonal to the column direction and the high-temperature buffer layers 8 of the second column are opposed to the element isolation grooves 5 of the first column in the direction orthogonal to the column direction in each pair of columns adjacent to each other (the pair of the left column and the central column and the pair of the central column and the right column in FIG. 3) same manner as the structure formed by arranging in two columns.

In the pair of the left column and the central column in FIG. 3, a p-type cladding layer 11a of each transistor 6 arranged on the left column, a p-type cladding layer 11b of the transistor 6 adjacent to a first side of this transistor 6 in the column direction and the high-temperature buffer layer 8 of each transistor 6 arranged on the central column are electrically connected by a wire 16. Further, the p-type cladding layer 11a of each transistor 6 arranged on the central column, the p-type cladding layer 11b of the transistor 6 adjacent to this transistor 6 on the first side in the column direction and the high-temperature buffer layer 8 of each transistor 6 arranged on the left column are electrically connected by a wire 17.

In the pair of the right column and the central column in FIG. 3, the p-type cladding layer 11a of each transistor 6 arranged on the right column, the p-type cladding layer 11b of the transistor 6 adjacent to the first side of this transistor 6 in the column direction and the high-temperature buffer layer 8 of each transistor 6 arranged on the central column are electrically connected by a wire 16. Further, the p-type cladding layer 11a of each transistor 6 arranged on the central column, the p-type cladding layer 11b of the transistor 6 adjacent to this transistor 6 on the first side in the column direction and the high-temperature buffer layer 8 of each transistor 6 arranged on the right column are electrically connected by a wire 17.

N-side electrodes 13 provided on the high-temperature buffer layers 8 of the transistors 6 arranged on respective first-side end portions of the two columns provided on both ends are connected to a wire bonding region 18 by wires 32. On the other hand, a p-side electrode 12a provided on the p-type cladding layer 11a of the transistor 6 arranged on a first-side end portion of the central column is connected to the wire bonding region 18 by a wire 33.

Further, p-side electrodes 12b provided on the p-type cladding layers 11b of the transistors 6 arranged on respective second-side end portions of the two columns provided on both ends are connected to a wire bonding region 19 by wires 34. On the other hand, the n-side electrode 13 provided on the high-temperature buffer layer 8 of the transistor 6 arranged on a second-side end portion of the central column is connected to the wire bonding region 19 by a wire 35.

Also according to this structure, effects similar to those of the structure formed by arranging the plurality of transistors in the two columns can be attained.

When the n-side electrodes 13 provided on the high-temperature buffer layers 8 of the transistors 6 arranged on the respective first-side end portions of the columns provided on both ends and the p-side electrode 12a provided on the p-type cladding layer 11a of the transistor 6 arranged on the first-side end portion of the central column are connected with one another by a wire, any one of the p-side electrode 12a and the n-side electrodes 13 may be connected to the wire bonding region 18, and two of the wires 32 and 33 can be omitted. When the p-side electrodes 12b provided on the p-type cladding layers 11b of the transistors 6 arranged on the respective second-side end portions of the columns provided on both ends and the n-side electrode 13 provided on the high-temperature buffer layer 8 of the transistor 6 arranged on the first-side end portion of the central column are connected with one another by a wire, any one of the p-side electrode 12b and the n-side electrodes 13 may be connected to the wire bonding region 19, and two of the wires 34 and 35 can be omitted.

Figure 4:
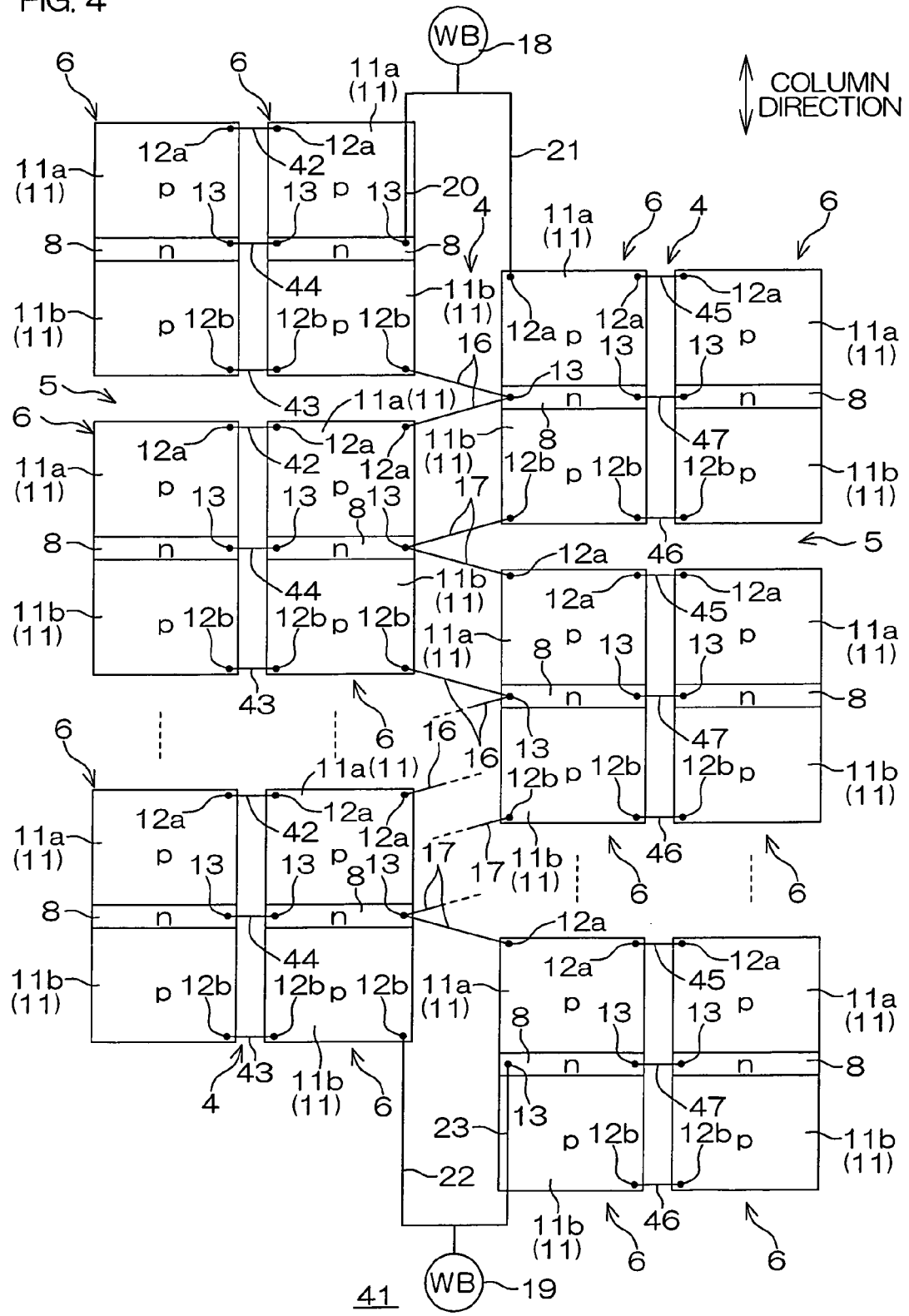
FIG. 4 A plan view schematically showing a structure formed by arranging a plurality of transistors in four columns.

FIG. 4 is a plan view schematically showing a structure formed by arranging a plurality of transistors 6 in four columns. Referring to FIG. 4, portions corresponding to the respective portions shown in FIG. 1 are denoted by the same reference numerals as the respective portions. In the following, detailed description as to the portions denoted by the same reference numerals is omitted.

A semiconductor light emitting device 41 shown in FIG. 4 is formed by arranging the plurality of transistors 6 in the four columns.

In the central two columns, the transistors 6 of the respective columns are so arranged that high-temperature buffer layers 8 of the first column are opposed to element isolation grooves 5 of the second column in a direction orthogonal to the column direction and the high-temperature buffer layers 8 of the second column are opposed to the element isolation grooves 5 of the first column in the direction orthogonal to the column direction. A p-type cladding layer 11*a* of each transistor 6 arranged on the first column, a p-type cladding layer 11*b* of the transistor 6 adjacent to a first side of this transistor 6 in the column direction and the high-temperature buffer layer 8 of each transistor 6 arranged on the second column are electrically connected by a wire 16. Further, the p-type cladding layer 11*a* of each transistor 6 arranged on the second column, the p-type cladding layer 11*b* of the transistor 6 adjacent to this transistor 6 on the first side in the column direction and the high-temperature buffer layer 8 of each transistor 6 arranged on the first column are electrically connected by a wire 17.

The transistors 6 of the leftmost column in FIG. 4 are so arranged that the p-type cladding layers 11*a* and 11*b* and the high-temperature buffer layers 8 are opposed to the p-type cladding layers 11*a* and 11*b* and the high-temperature buffer layers 8 of the transistors 6 in the column (the second column from the left side in FIG. 4) adjacent to this column in the direction orthogonal to the column direction respectively. Between the leftmost column and the column adjacent thereto, the p-type cladding layers 11*a* opposed to each other are connected with each other by wire 42, the p-type cladding layers 11*b* opposed to each other are connected with each other by a wire 43, and the n-side electrodes 13 opposed to each other are connected with each other by a wire 44.

The transistors 6 of the rightmost column in FIG. 4 are so arranged that the p-type cladding layers 11*a* and 11*b* and the high-temperature buffer layers 8 are opposed to the p-type cladding layers 11*a* and 11*b* and the high-temperature buffer layers 8 of the transistors 6 of the column (the second column from the right side in FIG. 4) adjacent to this column in the direction orthogonal to the column direction respectively. Between the rightmost column and the column adjacent thereto, the p-type cladding layers 11*a* opposed to each other are connected with each other by a wire 45, the p-type cladding layers 11*b* opposed to each other are connected with each other by a wire 46, and the n-side electrodes 13 opposed to each other are connected with each other by a wire 47.

Also according to this structure, effects similar to those of the structure formed by arranging the plurality of transistors in the two columns can be attained.

While the presents invention has been described in detail byway of the embodiments thereof, it should be understood that these embodiments are merely illustrative of the technical principles of the present invention but not limitative of the invention. The spirit and scope of the present invention are to be limited only by the appended claims.

In a case of arranging the plurality of transistors 6 in four or more columns, for example, a plurality of semiconductor light emitting devices 1 shown in FIG. 1 may be provided and parallelly connected to the AC source.

While the low-temperature buffer layer 7, the high-temperature buffer layer 8, the n-type cladding layer 9, the active layer 10 and the p-type cladding layer 11 which are gallium nitride semiconductor layers are stacked on the sapphire substrate 2 in the aforementioned embodiment, the present invention may be applied to a semiconductor light emitting device having a structure formed by stacking gallium nitride (GaAs) semiconductor layers on an insulating substrate or a semiconductor light emitting device having a structure formed by stacking indium gallium aluminum phosphorus (InGaAlP) semiconductor layers on an insulating substrate.

This application corresponds to Japanese Patent Application No. 2006-103325 filed in the Japanese Patent Office on Apr. 4, 2006, the disclosure of which is incorporated herein by reference in its entirety.

The invention claimed is:

1. A semiconductor light emitting device, comprising:
a substrate;
a plurality of transistors formed on the substrate in a plurality of columns, each transistor having a first conductivity type region and second conductivity type regions provided on both sides thereof in a column direction and having an active layer in each second conductivity region on the side of the substrate, the transistors being so arranged that the first conductivity type region of the first column is opposed to a space between transistors adjacent to each other in the second column in a direction orthogonal to the column direction, and the first conductivity type region of the second column is opposed to a space between transistors adjacent to each other in the first column in the direction orthogonal to the column direction;
a first wire electrically connecting the second conductivity type region on a first side in the column direction of the transistor arranged on a first column, the second conductivity type region on a second side in the column direction of the transistor adjacent to this transistor on the first side in the column direction and the first conductivity type region of the transistor arranged on a second column between two columns adjacent to each other; and
a second wire electrically connecting the second conductivity type region on the first side in the column direction of the transistor arranged on the second column, the second conductivity type region on the second side in the column direction of the transistor adjacent to this transistor on the first side in the column direction and the first conductivity type region of the transistor arranged on the first column between the two columns.

2. The semiconductor light emitting device according to claim 1, further comprising a semiconductor multilayer portion formed by stacking a plurality of gallium nitride semiconductor layers on the substrate, wherein each transistor is electrically isolated from another transistor in each column by an isolation groove formed by digging the semiconductor multilayer portion from a surface thereof in the stacking direction.

3. The semiconductor light emitting device according to claim 1, wherein the transistors are formed in two columns.

* * * * *